(12) United States Patent
Yoshioka

(10) Patent No.: US 10,516,413 B2
(45) Date of Patent: Dec. 24, 2019

(54) DIGITAL-TO-TIME CONVERTER AND INFORMATION PROCESSING APPARATUS

(71) Applicant: KABUSHIKI KAISHA TOSHIBA, Minato-ku (JP)

(72) Inventor: Kentaro Yoshioka, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/126,477

(22) Filed: Sep. 10, 2018

(65) Prior Publication Data

US 2019/0288703 A1 Sep. 19, 2019

(30) Foreign Application Priority Data

Mar. 19, 2018 (JP) .................. 2018-051613

(51) Int. Cl.
*H03M 1/82* (2006.01)
(52) U.S. Cl.
CPC ..................... *H03M 1/82* (2013.01)
(58) Field of Classification Search
CPC ....................................... H03M 1/82

USPC ................. 341/144, 152; 331/157; 257/275; 327/158

See application file for complete search history.

(56) References Cited

U.S. PATENT DOCUMENTS

| 8,988,262 | B2 | 3/2015 | Miyashita | |
|---|---|---|---|---|
| 2002/0097099 | A1* | 7/2002 | Miyamoto | H03L 3/00 331/74 |
| 2002/0190283 | A1* | 12/2002 | Seno | G06F 1/10 257/275 |
| 2004/0263266 | A1* | 12/2004 | Rosenbaum | H03K 5/133 331/57 |
| 2015/0200677 | A1* | 7/2015 | Ainspan | H03L 7/0992 327/158 |
| 2018/0351571 | A1* | 12/2018 | Buffa | H03M 1/504 |

* cited by examiner

*Primary Examiner* — Peguy Jean Pierre
(74) *Attorney, Agent, or Firm* — Oblon, McClelland, Maier & Neustadt, L.L.P.

(57) ABSTRACT

A digital-to-time converter has an oscillator; and count circuitry that starts counting a number of oscillations of the oscillator when an activation signal is input, and outputs a first delay activation signal obtained by delaying the activation signal during a period from a timing when the activation signal is input to a timing when a counted number of oscillations reaches a reference number set based on a digital input signal.

7 Claims, 9 Drawing Sheets

US 10,516,413 B2

DIGITAL-TO-TIME CONVERTER AND INFORMATION PROCESSING APPARATUS

CROSS REFERENCE TO RELATED APPLICATIONS

This application is based upon and claims the benefit of priority from the prior Japanese Patent Application No. 2018-51613, filed on Mar. 19, 2018, the entire contents of which are incorporated herein by reference.

FIELD

Embodiments of the present invention relate to a digital-to-time converter and an information processing apparatus.

BACKGROUND

A digital-to-time converter that outputs a pulse signal having a pulse width corresponding to a digital input signal is known. With this type of digital-to-time converter, a plurality of delay circuits having different delay times are connected in series, and whether each delay circuit is operated is selected by a digital input signal.

However, with this type of digital-to-time converter, there is a problem that as the number of bits of the digital input signal increases, the number of delay circuits increases exponentially and the circuit scale rapidly increases.

DETAILED DESCRIPTION

According to one embodiment, a digital-to-time converter has digital-to-time converter has an oscillator, and count circuitry that starts counting a number of oscillations of the oscillator when an activation signal is input, and outputs a first delay activation signal obtained by delaying the activation signal during a period from a timing when the activation signal is input to a timing when a counted number of oscillations reaches a reference number set based on a digital input signal.

Hereinafter, embodiments will be described with reference to the drawings. In this specification and the accompanying drawings, some components are omitted, changed or simplified for ease of understanding and illustration, and are explained and illustrated. Technical details with the extent to which the same function can be expected are also included in and interpreted as the present embodiment.

First Embodiment

Figure 1:
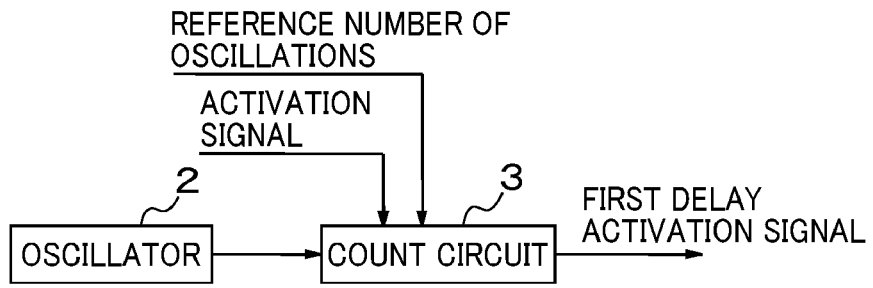
FIG. 1 is a block diagram showing a schematic configuration of a digital-to-time converter 1 according to a first embodiment.

FIG. 1 is a block diagram showing a schematic configuration of a digital-to-time converter 1 according to a first embodiment. The digital-to-time converter 1 in FIG. 1 includes an oscillator 2 and a count circuit 3.

The oscillator 2 performs an oscillation operation and outputs an oscillation signal with a predetermined oscillation frequency. The oscillator 2 may continue the oscillation operation while the power supply voltage is being supplied, or may perform the oscillation operation only when the activation signal is input from the outside. As will be described later, the oscillator 2 may be configured by a ring oscillator in which a plurality of logic inversion elements (inverters) is cascaded in a ring shape, for example. Here, the input of the activation signal (trigger signal) means that the activation signal is treated as having a specific logic. For example, in a specific logic, the activation signal is input at the timing when the activation signal changes from the low level to the high level.

The oscillation signal output from the oscillator 2 is input to the count circuit 3. In addition to this, the activation signal and the reference number of oscillations are input to the count circuit 3. The count circuit 3 starts counting the number of oscillations of the oscillator 2 at a timing when an activation signal is input, and outputs a first delay activation signal obtained by delaying the activation signal during a period until the counted number of oscillations reaches a reference number of oscillations in accordance with a digital input signal. The reference number of oscillations to be input to the count circuit 3 can be designated by at least part of the bit string of the digital input signals, for example.

The digital-to-time converter 1 in FIG. 1 can set any delay time for delaying the activation signal by the digital input signal. By increasing the number of bits of the digital input signal, the delay time of the activation signal can be finely set. That is, the resolution of the delay time of the activation signal can be adjusted by the number of bits of the digital input signal.

Figure 2:
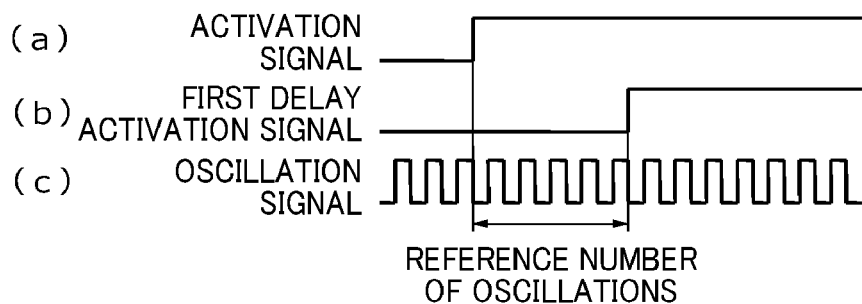
FIG. 2 is a timing chart of the digital-to-time converter 1 in FIG. 1.

FIG. 2 is a timing chart of the digital-to-time converter 1 in FIG. 1. As seen from FIG. 2, the count circuit 3 outputs the first delay activation signal obtained by delaying the activation signal by the reference number of oscillations of the oscillation signal output from the oscillator 2.

Figure 3:
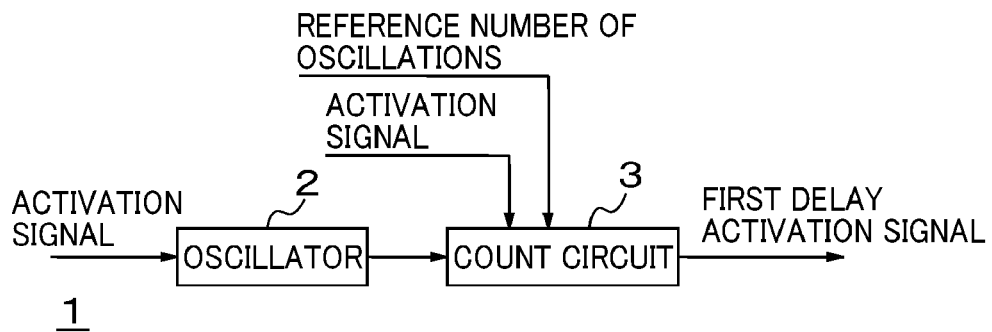
FIG. 3 is a block diagram showing a schematic configuration of a digital-to-time converter according to a first modification in FIG. 1.

FIG. 3 is a block diagram showing a schematic configuration of the digital-to-time converter 1 according to the first modification in FIG. 1. The digital-to-time converter 1 in FIG. 3 is different from the digital-to-time converter 1 in FIG. 1 in that the activation signal is input not only to the count circuit 3 but also to the oscillator 2. The oscillator 2 in FIG. 3 performs an oscillation operation in synchronization with the activation signal. That is, the oscillator 2 in FIG. 3 performs an oscillation operation when the activation signal is input (for example, when the activation signal is at a high level), and stops the oscillation operation when the activation signal is not input (for example, when the activation signal is at a low level). The count circuit 3 in FIG. 3 counts oscillation signals output from the oscillator 2 until the number of the oscillation signals reaches the reference number of oscillations, and outputs the first delay activation signal in synchronization with the timing at which the number of the oscillation signals reaches the reference number of oscillations. With the digital-to-time converter 1 in FIG. 3, since the oscillator 2 performs the oscillation operation only when the activation signal is input, the power consumption of the oscillator 2 can be suppressed.

Figure 4:
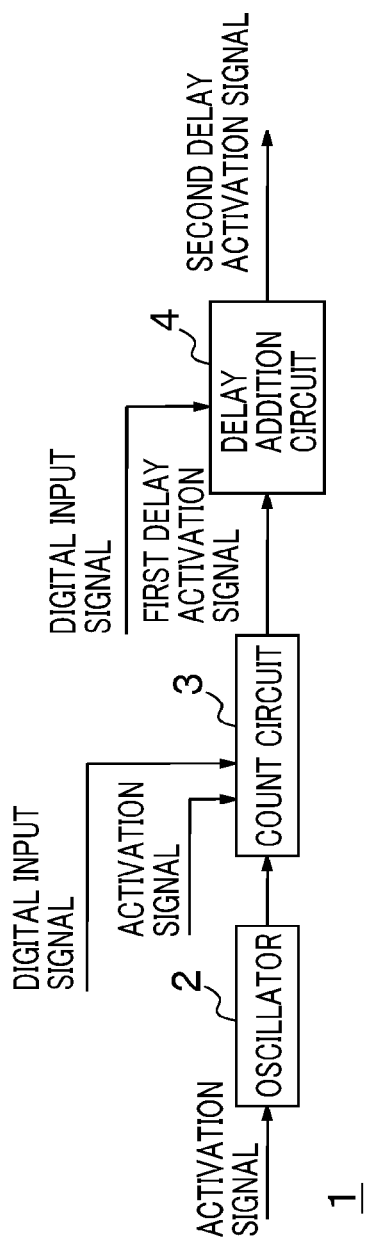
FIG. 4 is a block diagram showing a schematic configuration of a digital-to-time converter according to a second modification in FIG. 1.

FIG. 4 is a block diagram showing a schematic configuration of the digital-to-time converter 1 according to a second modification in FIG. 1. The digital-to-time converter 1 in FIG. 4 has a configuration in which a delay addition circuit 4 is added to the digital-to-time converter 1 in FIG. 3. The delay addition circuit 4 may be added to the digital-to-time converter 1 in FIG. 1.

The delay addition circuit 4 outputs a second delay activation signal obtained by delaying the first delay activation signal for a delay time in accordance with the digital input signal. The delay addition circuit 4 outputs a second delay activation signal obtained by delaying the first delay activation signal for a delay time in accordance with at least low-order bits (LSB: Least Significant Bit) of the digital input signal. In addition, the delay addition circuit 4 may set, based on the low-order bits of the digital input signal including at least part of the high-order bits (MSB: Most Significant Bit) of the digital input signal input to the count circuit 3, the delay time of the second delay activation signal.

For example, the high-order bits of the digital input signal is input to the count circuit 3 to set the reference number of oscillations, and the low-order bits of the digital input signal is input to the delay addition circuit 4, whereby the delay time of the first delay activation signal may be set. As a result, the rough delay time of the activation signal can be set by the count circuit 3, and the delay time of the activation signal can be finely adjusted by the delay addition circuit 4.

Figure 5:
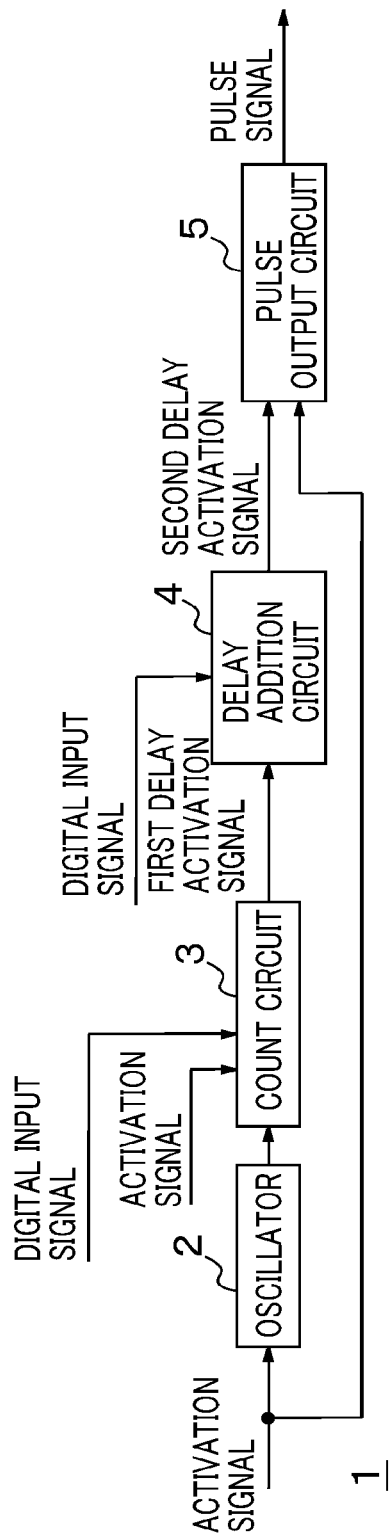
FIG. 5 is a block diagram showing a schematic configuration of a digital-to-time converter according to a third modification in FIG. 1.

FIG. 5 is a block diagram showing a schematic configuration of the digital-to-time converter 1 according to a third modification in FIG. 1. The digital-to-time converter 1 in FIG. 5 has a configuration in which a pulse output circuit 5 is added to the digital-to-time converter 1 in FIG. 4. The pulse output circuit 5 outputs a pulse signal having a pulse width in accordance with the digital input signal based on the activation signal and the second delay activation signal. For example, as shown in FIG. 2, the pulse output circuit 5 outputs a pulse signal having a pulse width from a rising edge of the activation signal to a rising edge of the second delay activation signal. In this way, the digital-to-time converter 1 in FIG. 5 operates as a digital pulse converter.

Figure 6:
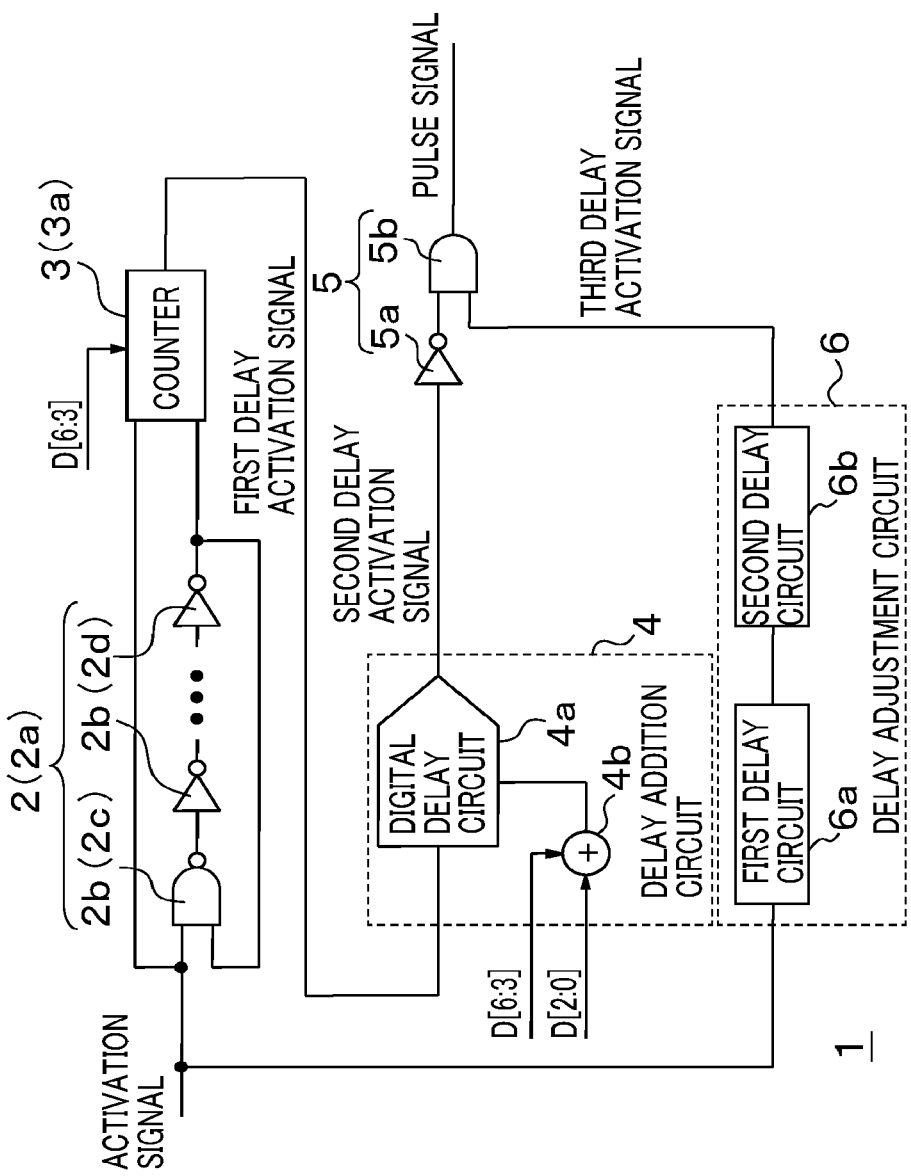
FIG. 6 is a circuit diagram embodying the digital-to-time converter in FIG. 5.

FIG. 6 is a circuit diagram embodying the digital-to-time converter 1 in FIG. 5. The digital-to-time converter 1 in FIG. 6 includes the oscillator 2, the count circuit 3, the delay addition circuit 4, the pulse output circuit 5, and a delay adjustment circuit 6.

The oscillator 2 in FIG. 6 is, for example, a ring oscillator 2a. In this ring oscillator 2a, a plurality of logic inversion elements 2b are cascaded in a ring shape. In the ring oscillator 2a in FIG. 6, the first stage logic inversion element 2b is a 2-input NAND gate 2c and the logic inversion elements 2b of the second and subsequent stages are inverters 2d. The specific circuit elements constituting the logic inversion elements 2b may be any elements. The NAND gate 2c in FIG. 6 performs a NAND operation of the activation signal and the output signal of the last stage inverter 2d. When the activation signal is at the low level, the output of the NAND gate 2c is fixed to high, so that the ring oscillator 2a stops the oscillation operation. When the activation signal is at the high level, the NAND gate 2c functions as the logic inversion element 2b and performs oscillation operation at a frequency in accordance with the number of stages including the NAND gate 2c and the inverters 2d. The oscillation frequency is determined by the number of stages of the plurality of cascaded logic inversion elements 2b in the ring oscillator 2a and the signal delay time of each logic inversion element 2b. For example, when the number of stages of the plurality of logic inversion elements 2b is m (m is an integer of 2 or more) and the signal delay time of each logic inversion element 2b is tinv, the oscillation frequency f=2m×tinv.

Figure 7:
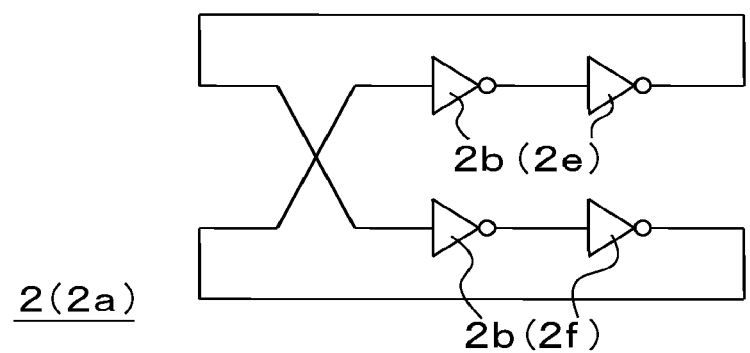
FIG. 7 is a circuit diagram showing a modification of a ring oscillator.

The number of stages of the logic inversion elements 2b in the ring oscillator 2a may be an odd number or an even number. In the case of odd-numbered stages, as shown in FIG. 6, it suffices to input the output signal of the last stage logic inversion element 2b to the first stage logic inversion element 2b. In the case of even-numbered stages, for example as shown in FIG. 7, a first logic inversion element group 2e including a plurality of cascaded logic inversion elements 2b and a second logic inversion element group 2f including a plurality of cascaded logic inversion elements 2b are provided, the output signal of the last stage logic inversion element 2b in the first logic inversion element group 2e is input to the first stage logic inversion element 2b in the second logic inversion element group 2f, and the output signal of the last stage logic inversion element 2b in the second logic inversion element group 2f is input to the first stage logic inversion element 2b in the first logic inversion element group 2e. When the ring oscillator 2a is constituted by even-numbered stages of logic inversion elements 2b as shown in FIG. 7, although the total number of the logic inversion elements 2b increases, compared with the number in the case of the odd number stages, since the oscillation frequency of the oscillation signal can be adjusted by a power of 2, the delay time can be adjusted by binary number, whereby the digital-to-time converter 1 can be designed without difficulty.

The count circuit 3 in FIG. 6 has a counter 3a. The larger the number of bits countable by the counter 3a is, the higher the resolution of delay setting can be made. High-order bits D[6:3] of the digital input signal is input to the counter 3a, and the reference number of oscillations is set by this high-order bits. In the example of FIG. 6, the total number of bits of the digital input signal D[6:0] is 7 bits, and the high-order bits D[6:3] of them are input to the counter 3a. It is necessary to increase the number of bits of the counter 3a as the number of bits of the high-order bits input to the counter 3a increases. The counter 3a has a shift register as a main circuit component, and even when the number of bits is increased, the circuit scale does not significantly increase.

The counter 3a performs a counting operation in synchronization with the oscillation signal output from the oscillator 2, and when the count number reaches the reference number of oscillations, outputs the first delay activation signal obtained by delaying the activation signal for the period during which the counter 3a has performed the count operation.

When the number of connection stages of the logic inversion elements 2b in the ring oscillator 2a is, for example, 7 stages and the signal delay time of each logic inversion element 2b is tinv, the oscillation frequency of the ring oscillator 2a is represented by 7×2×tinv=14 tinv. Therefore, when the reference number of oscillations is m times (m is an integer of 1 or more), the counter 3a outputs the first delay activation signal obtained by delaying the activation signal by 14 tinv×m.

The delay addition circuit 4 in FIG. 6 has a digital delay circuit 4a and a delay control circuit 4b. The digital delay circuit 4a outputs the second delay activation signal obtained by delaying the first delay activation signal for the delay time in accordance with the delay control signal output from the delay control circuit 4b.

Figure 8:
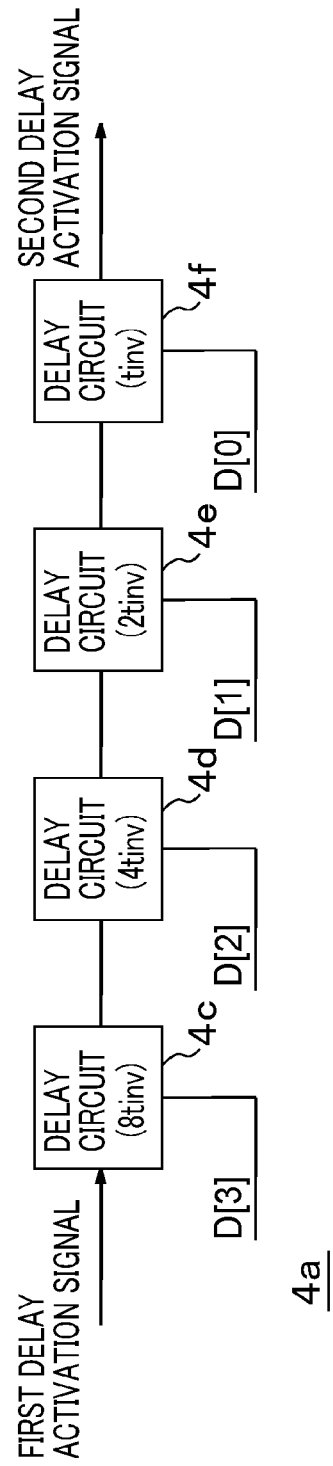
FIG. 8 is a block diagram showing an example of an internal configuration of a digital delay circuit.

FIG. 8 is a block diagram showing an example of an internal configuration of the digital delay circuit 4a. The digital delay circuit 4a in FIG. 8 has a configuration in which a plurality of delay circuits 4c, 4d, 4e, and 4f having different delay times are connected in series. The first delay activation signal output from the count circuit 3 is input to the first stage delay circuit 4c. In the example of FIG. 8, the delay time of the first stage delay circuit 4c is 8 tinv, the delay time of the second stage delay circuit 4d is 4 tinv, the delay time of the third stage delay circuit 4e is 2 tinv, and the delay time of the last stage delay circuit 4f is tinv. This is an example, and it is not always necessary to set a difference in the delay time of a power of 2. In the example of FIG. 8, when the signal delay time of each logic inversion element 2b in the ring oscillator 2a is tinv, the delay time of each delay circuit 4c is set so as to be a multiple of the signal delay time. This is to reduce the error of the delay time.

The corresponding bits of the bit string constituting the delay control signal output from the delay control circuit 4b is input to each of the delay circuits 4c to 4f. For example, when the delay control signal is the bit string D[3:0] of 4 bits, the most significant bit D[3] is input to the first stage delay circuit 4c and D[2] is input to the second stage delay circuit 4d, D[1] is input to the third stage delay circuit 4e, and D[0] is input to the last stage delay circuit 4f. Each of the delay circuits 4c to 4f delays and outputs the input signal when the corresponding bit of the delay control signal is 1, and outputs the input signal without delaying the input signal when the bit is 0.

The delay control circuit 4b generates the delay control signal by bit-adding the high-order bits D[6:3] and the low-order bits D[2:0] of the digital input signal. For example, when D[6:3]=0001 and D[2:0]=000, the delay control circuit 4b outputs 0001 as the delay control signal.

The delay adjustment circuit 6 in FIG. 6 includes a first delay circuit 6a for delaying the activation signal by the signal delay time in the count circuit 3, and a second delay circuit 6b for delaying the activation signal by the signal delay time in the digital delay circuit 4a. The delay adjustment circuit 6 in FIG. 6 outputs a third delay activation signal obtained by delaying the activation signal by the signal delay time in the count circuit 3 and the digital delay circuit 4a.

The pulse output circuit 5 generates and outputs a pulse signal based on the second delay activation signal output from the digital delay circuit 4a and the third delay activation signal output from the delay adjustment circuit 6. The pulse output circuit 5 in FIG. 6 has an inverter 5a for inverting the logic of the second delay activation signal and an AND gate 5b that outputs a logical product signal of the output of the inverter 5a and the third delay activation signal. The specific circuit configuration of the pulse output circuit 5 is not limited. As a result, the pulse output circuit 5 outputs a pulse signal having a pulse width corresponding to the digital input signal.

In this manner, the count circuit 3 according to the first embodiment generates the first delay activation signal obtained by delaying the activation signal for the delay time in accordance with the high-order bits of the digital input signal. The delay addition circuit 4 generates the second delay activation signal obtained by delaying the first delay activation signal for the delay time in accordance with the high-order bits and the low-order bits of the digital input signal. The delay adjustment circuit 6 generates the third delay activation signal obtained by delaying the activation signal for the signal delay time of the count circuit 3 and the delay addition circuit 4. The pulse output circuit 5 generates the pulse signal based on the second delay activation signal and the third delay activation signal.

According to the first embodiment, even when the number of bits of the digital input signal increases, only the number of bits of the counter 3a in the count circuit 3 increases, and the overall circuit scale does not significantly increase.

Further, in the present embodiment, the delay time of the activation signal is roughly set by the count circuit 3 and the delay time of the activation signal is finely set by the delay addition circuit 4, so that it is possible to suppress an increase in the circuit scale without deteriorating the accuracy of the delay time.

Second Embodiment

The digital-to-time converter 1 shown in FIG. 5 or FIG. 6 can be used for product-sum operation processing of digital input signals.

Figure 9:
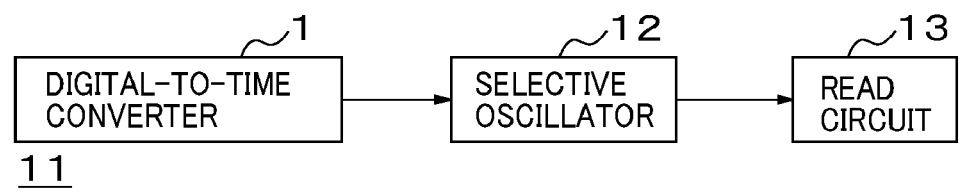
FIG. 9 is a block diagram showing a schematic configuration of an information processing apparatus including a digital-to-time converter according to a second embodiment.

FIG. 9 is a block diagram showing a schematic configuration of an information processing apparatus 11 including the digital-to-time converter 1 according to a second embodiment. The information processing apparatus 11 in FIG. 9 includes the digital-to-time converter 1 in FIG. 5 or 6, a selective oscillator 12, and a read circuit 13.

Figure 10:
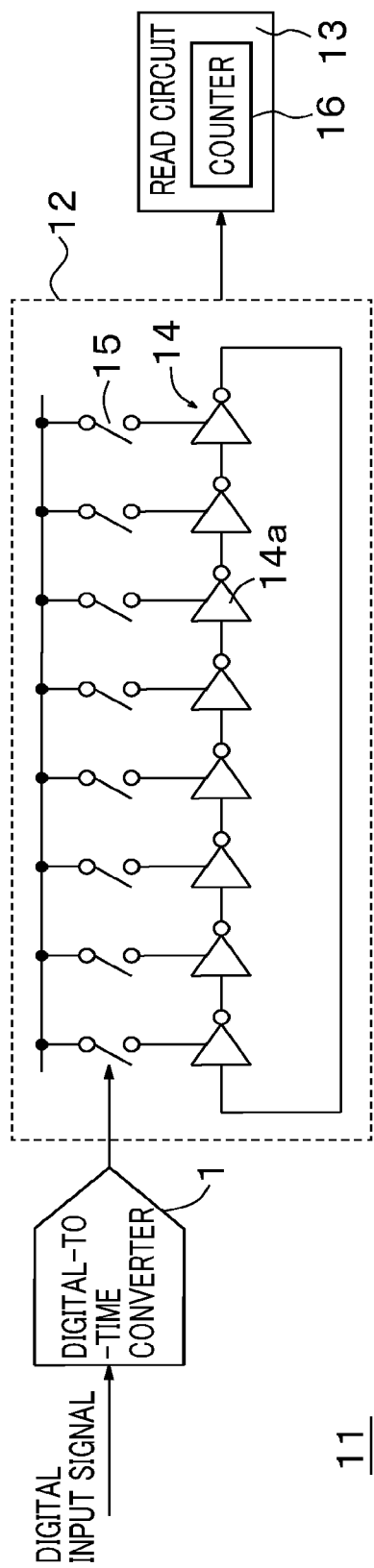
FIG. 10 is a diagram showing an example of an internal configuration of a selective oscillator.

The selective oscillator 12 performs an oscillation operation while the pulse signal is outputting a pulse, and holds the oscillation operation state at the time when the output of the pulse is stopped. FIG. 10 is a diagram showing an example of an internal configuration of the selective oscillator 12. The selective oscillator 12 has a ring oscillator 14 and a plurality of switches 15. The ring oscillator 14 has a plurality of delay elements 14a connected in a ring shape, and sequentially transmits an initial pulse signal by a plurality of delay elements 14a. Each of the delay elements 14a can be constituted by, for example, an inverter.

Each of the plurality of switches 15 is provided corresponding to respective delay elements 14a. Each of the switches 15 switches whether to cause the corresponding delay element 14a to perform a delay operation. For example, each delay element 14a delays and outputs the output signal of the delay element 14a at the preceding stage when the corresponding switch 15 is on, and stops the delay operation of the signal transmission when the corresponding switch 15 is off. All the switches 15 are turned on or off synchronously.

The read circuit 13 has a counter 16 which counts up every time the initial pulse signal goes around the ring oscillator 14. A read circuit 13 detects the number of oscillations according to the count value of the counter 16 and detects a phase state indicating which delay element 14a in the ring oscillator 14 holds the initial pulse signal. Then, the read circuit 13 generates and outputs a digital output signal including the number of oscillations and the phase state.

Figure 11:
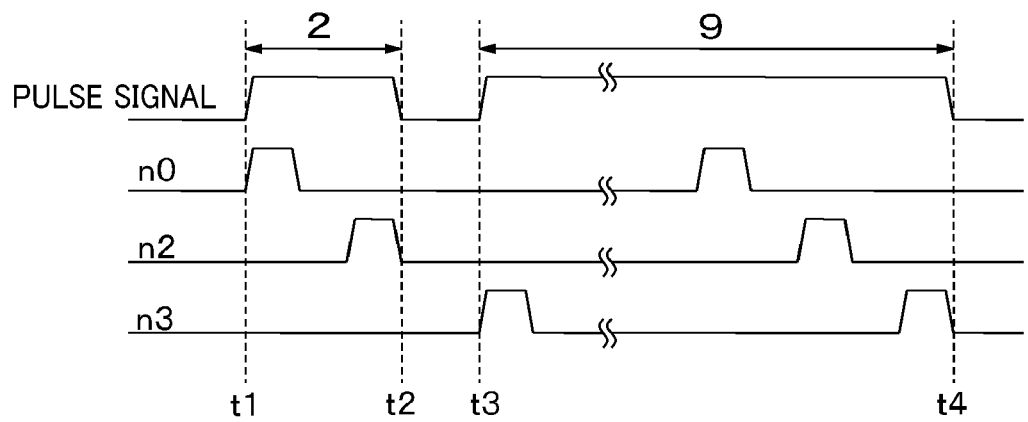
FIG. 11 is a timing chart when N digital input signals where N=2 are sequentially input to the information processing apparatus in FIG. 9.

FIG. 11 is a timing chart when N digital input signals where N=2 are sequentially input to the information processing apparatus 11 in FIG. 9. FIG. 11 shows an example in which 2 and 9 are sequentially input as digital input signals. Here, it is assumed that the selective oscillator 12 is initialized to a desired state. The duty of the oscillation state is ignored and the phase state is replaced with a pulse for the sake of simplicity. The ring oscillator 14 is reset once before the first digital input signal is input, and an initial pulse signal with a predetermined pulse length is input to the first stage delay element 14a. When the first digital input signal (=2) is input to a digital-to-pulse converter (time t1), the digital-to-pulse converter outputs a pulse signal including a pulse having a pulse length corresponding to two times the delay quantity of the delay element 14a. While this pulse having the pulse length is being output, all the switches 15 are turned on, and the power supply voltage is supplied to all the delay elements 14a. In the initial state, since the initial pulse signal is input to the input terminal of the first stage delay element 14a, this initial pulse signal is propagated to the output terminal of the delay element 14a at the second stage from the left. When the pulse signal output from the digital-to-pulse converter falls to the low level at the time t2, all the switches 15 are turned off, and the delay element 14a at the second stage from the left holds a high level, which is the immediately preceding signal level.

Thereafter, when the second digital input signal (=9) is input (time t3), the digital-to-pulse converter outputs a pulse signal including a pulse having a pulse length corresponding to nine times the delay quantity of the delay element 14a. While this pulse having the pulse length is being output, all the switches 15 are turned on, and the power supply voltage is supplied to all the delay elements 14a. Therefore, the initial pulse signal held by the second delay element 14a from the left is propagated sequentially to nine delay elements 14a. Since there are six delay elements 14a from the second delay element 14a to the rightmost delay element 14a, when the initial pulse signal propagated from the rightmost delay element 14a to the leftmost delay element 14a, at the time point t4 is propagated further to the third stage delay element 14a from the left, all the switches 15 are turned off. Therefore, the initial pulse signal is held by the third stage delay element 14a from the left.

As described above, the information processing apparatus 11 in FIG. 9 can integrate a plurality of digital input signals with a simple circuit configuration by using a single selective oscillator 12. Further, in the information processing apparatus 11 in FIG. 9, a plurality of integrating and summing operations can be performed using the same selective oscillator 12, so that even when the number of digital input signals to be calculated increases, integration and sum calculation of a large number of digital input signals can be performed by the information processing apparatus 11 having a simple circuit configuration without complicating the configuration of the information processing apparatus 11.

In addition, by applying a weight signal to the digital input signal, product-sum operations can be performed. In the arithmetic processing of artificial intelligence (AI: Artificial Intelligence), since it is necessary to perform a large number of product-sum operations, arithmetic processing of AI can be performed at a high speed with hardware by applying the information processing apparatus 11 in FIG. 9.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A digital-to-time converter comprising:
an oscillator; and
count circuitry that:
starts counting a number of oscillations of the oscillator when an activation signal is input; and
outputs a first delay activation signal obtained by delaying the activation signal during a period from a timing when the activation signal is input to a timing when a counted number of oscillations reaches a reference number set based on a first part of a digital input signal, the first part comprising high-order bits of the digital input signal,
delay addition circuitry that outputs a second delay activation signal obtained by delaying the first delay activation signal for a delay time set by the digital input signal based on a second part of the digital input signal including at least a portion of the first part of the digital input signal input to the count circuitry, the second part comprising low-order bits of the digital input signal.

2. The digital-to-time converter according to claim 1, wherein the count circuitry outputs the first delay activation signal at the timing when the counted number of oscillations reaches the reference number.

3. The digital-to-time converter according to claim 1, wherein the delay addition circuitry comprises a plurality of delay circuitries with different delay quantities, the delay circuitries being connected in series to each other, wherein the first delay activation signal is input to first stage delay circuitry among the delay circuitries connected in series to each other, and
wherein whether to delay the first delay activation signal for each of the plurality of delay circuitries is selected based on the low-order bits.

4. The digital-to-time converter according to claim 1, further comprising:
pulse output circuitry that outputs a pulse signal having a pulse width in accordance with the digital input signal based on the activation signal and the second delay activation signal.

5. The digital-to-time converter according to claim 4, further comprising:
delay adjustment circuitry that delays the activation signal according to a signal delay based on the oscillator and the count circuitry and a signal delay based on the delay addition circuitry,
wherein the pulse output circuitry outputs the pulse signal based on a signal obtained by delaying the activation signal by the delay adjustment circuitry and the second delay activation signal.

6. The digital-to-time converter according to claim 1, wherein the oscillator includes a plurality of first logic inversion elements cascaded in a ring shape, and
wherein the delay addition circuitry comprises two or more second logic inversion elements having the same delay time as the plurality of first logic inversion elements.

7. An information processing apparatus comprising:
a digital-to-time converter that outputs a pulse signal having a pulse width in accordance with a digital input signal;
a selective oscillator that performs an oscillation operation during a period of the pulse width of the pulse signal and holds an oscillation operation state at a time when the period ends; and read circuitry that outputs a digital output signal including the oscillation operation state,
wherein the digital-to-time converter comprises
an oscillator,
count circuitry that:
  start counting a number of oscillations of the oscillator when an activation signal is input; and
  output a first delay activation signal obtained by delaying the activation signal during a period from a timing when the activation signal is input to a timing when a counted number of oscillations reaches a reference number set based on a digital input signal,
delay addition circuitry that outputs a second delay activation signal obtained by delaying the first delay activation signal for a delay time based on the digital input signal, and
pulse output circuitry that outputs the pulse signal having a pulse width in accordance with the digital input signal based on the activation signal and the second delay activation signal.

* * * * *